United States Patent
Pike

(10) Patent No.: US 6,987,317 B2
(45) Date of Patent: Jan. 17, 2006

(54) POWER DELIVERY USING AN INTEGRATED HEAT SPREADER

(75) Inventor: Eric Pike, Chandler, AZ (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 10/676,547

(22) Filed: Sep. 30, 2003

(65) Prior Publication Data

US 2005/0067691 A1    Mar. 31, 2005

(51) Int. Cl.
*H01L 23/34*    (2006.01)

(52) U.S. Cl. .............. 257/717; 257/706; 257/712; 257/713; 257/720; 361/704; 361/707

(58) Field of Classification Search ........... 361/704, 361/707, 709, 710, 717–720; 165/185; 257/706, 257/707, 712–722

See application file for complete search history.

(56) References Cited

U.S. PATENT DOCUMENTS

| | | | |
|---|---|---|---|
| 5,535,816 A * | 7/1996 | Ishida | 165/80.3 |
| 6,195,256 B1 * | 2/2001 | Tiziani et al. | 361/704 |
| 6,552,267 B2 * | 4/2003 | Tsao et al. | 174/52.4 |
| 6,563,709 B2 * | 5/2003 | Negishi et al. | 361/699 |
| 6,896,039 B2 * | 5/2005 | Dussinger et al. | 165/104.26 |
| 6,903,929 B2 * | 6/2005 | Prasher et al. | 361/699 |
| 2004/0262766 A1 * | 12/2004 | Houle | 257/758 |

* cited by examiner

*Primary Examiner*—Mary Wilczewski
*Assistant Examiner*—Monica Lewis
(74) *Attorney, Agent, or Firm*—Blakely, Sokoloff, Taylor & Zafman LLP

(57) ABSTRACT

An integrated heat spreader (IHS) having a groove and a cavity formed therein is disclosed. In one embodiment, the groove has an insulating layer formed therein, and a power conduit is mounted in the groove, the power conduit is electrically isolated from the IHS by the insulating layer, and the power conduit conducts a voltage relative to the IHS to deliver power to the cavity. In another embodiment, the IHS is soldered to a semiconductor die and a package substrate. In a further embodiment, the power conduit comprises an edge connector.

10 Claims, 12 Drawing Sheets

POWER DELIVERY USING AN INTEGRATED HEAT SPREADER

FIELD OF THE INVENTION

The present invention relates generally to semiconductor packaging, and specifically to power delivery to semiconductor dies.

BACKGROUND

Integrated circuits (ICs), and especially microprocessors, are becoming increasingly complex. As a result, current microprocessors are requiring more and more power, in some cases up to 200 watts. A semiconductor package may use a package substrate to deliver power from a power supply to a semiconductor die. Current traveling through a package substrate may encounter substantial resistance. The resistance will generate heat, which can affect the performance and reliability of the die.

FIG. 1A illustrates a cross section of a typical semiconductor package. The semiconductor package 10 includes a package substrate 12, a semiconductor die 14, and an integrated heat spreader (IHS) 16. The IHS 16 dissipates heat generated by the semiconductor die 14. The semiconductor die 14 is mounted to both the package substrate 12 and the IHS 16. The IHS 16 is mounted to the package substrate 12 using an epoxy or adhesive film 18. In order to power the semiconductor die 14, an external power source drives current through conductive lines known as planes and vias in the package substrate 12. The current path 20 is shown originating from beneath the package substrate 12 and traveling through the package substrate 12 and into the semiconductor die 14.

FIG. 1B shows a more detailed view of the package substrate 12. The package substrate 12 may comprise a plastic, ceramic, silicon, etc. core having several conductive lines formed therein. The conductive lines transfer power and signals from an external power supply and external input/output (I/O) devices to the semiconductor die 14. The conductive lines of the package substrate 12 comprise planes and vias. The vias 22 and 24 can transmit current and signals vertically through the package substrate 12. The planes 26, 28, 30, and 32 can transfer current and signals horizontally through the package substrate 12. Current may enter the package substrate 12 through the bottom of the via 24. Once the current enters the package substrate 12, the current will travel horizontally along the planes 26–32 and into the via 22. Once the current reaches the via 22, it will travel through the top of the via 22 into the semiconductor die 14. Other planes and vias may be present in the package substrate 12 to provide a ground and to transmit signals to the semiconductor die 14.

As can be seen in FIG. 1B, the vias 22 and 24 have a greater cross sectional area than the planes 26–32. Further, current typically travels a shorter distance through the vias 22 and 24 than through the planes 26–32. As a result of both of these factors, most of the resistance typically found in a package substrate 12 is encountered during horizontal power delivery. In some package applications, as much as 90% of the total resistance in a package substrate 12 occurs in the planes 26–32. As a result, lateral power delivery tends to be the greater problem, since current travels well in the vertical direction.

In order to reduce the amount of lateral resistance, more planes can be added to the package substrate 12. However, the additional planes can be expensive, on the order of ten cents per plane. Further, using current technologies, the practical limit on the amount of planes that can be added to a package substrate 12 is about 200–400 micrometers ($\mu$m) of total length. Even with 400 $\mu$m of planes in a package substrate 12, there will still be significant resistance.

Another problem is that the metal used for planes 26–32 and vias 22 and 24, and the materials used for the substrate core 34 expand at different rates when heated. For example, the coefficient of thermal expansion (CTE) for copper is approximately 17 ppm/K, while the CTE for silicon is approximately 2.3–2.4 ppm/K. When the planes 26–32 are conducting current, the package substrate 12 will heat up, and the substrate core 34 and the metal will expand at different rates. This can ultimately lead to reliability problems including damage to the package substrate 12 and/or the semiconductor die 14. The problem becomes more acute when additional planes are added or more power is driven through the package substrate 12. The differing CTEs of the two materials limits the number of planes that can be added to a package substrate 12.

DETAILED DESCRIPTION

Figure 1A:
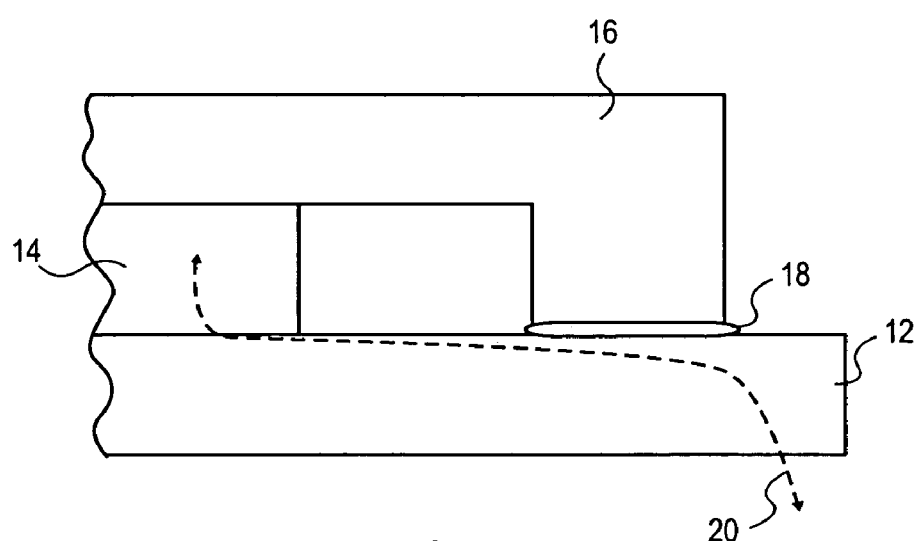
FIG. 1A illustrates a cross section of a typical semiconductor package.
Figure 1B:
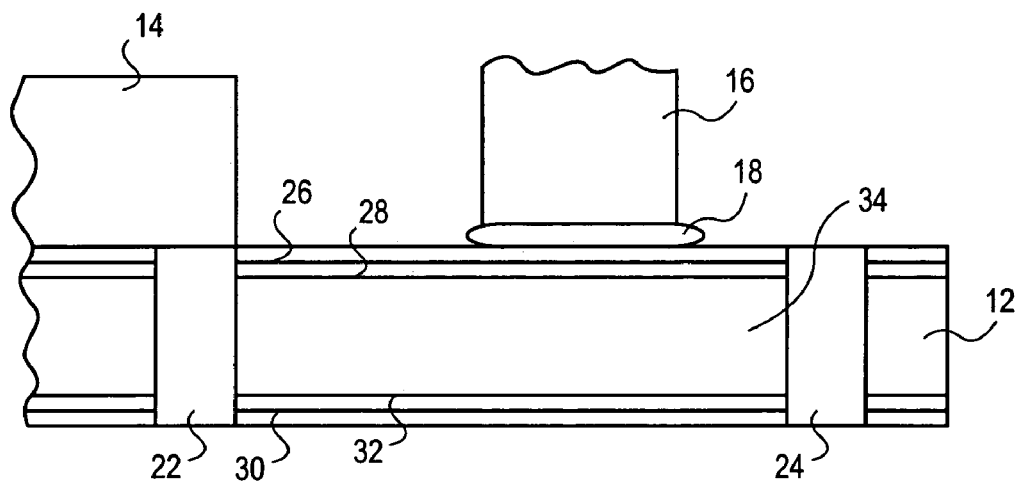
FIG. 1B shows a more detailed view of a package substrate.

Described herein is a method and apparatus for reducing resistance in semiconductor packaging applications. In the following description numerous specific details are set forth. However, it is understood that embodiments may be practiced without the specific details. For example, well known equivalent materials may be substituted in place of those described herein, and similarly, well known equivalent techniques may be substituted in place of particular semiconductor processing techniques disclosed. In other instances, well known structures and techniques have not been shown in detail in order not to obscure the understanding of this description.

An integrated heat spreader (IHS) can be added to semiconductor packages to maintain a proper operating temperature. The IHS can be modified to deliver power to a semiconductor die. An IHS is typically inexpensive and easy to modify, whereas additional planes in a package substrate can cost on the order of $0.10 each, and can lead to physical problems related to thermal expansion. Additional planes only make incremental improvements in reducing the amount of resistance. The IHS can be configured to deliver power to a semiconductor die and placed on top of a package substrate. The current can enter the package substrate and travel through the IHS toward the semiconductor die.

A semiconductor package may include an IHS to dissipate heat generated by a semiconductor die. The IHS comprises a conductive material that can be used for power delivery. In order to deliver power, the IHS is modified so that it can carry both power and ground current, which must be isolated from one another. When an IHS is manufactured, it can have one or more grooves formed in it. The grooves can accommodate power conduits. The power conduits can conduct a $V_{CC}$ voltage relative to the body of the IHS, which can be a $V_{SS}$ ground. In another embodiment, multiple power levels can be used. For example, one power conduit can deliver $V_{CC}$, while another might deliver +3.3V, and another +2.7V. An IHS having power conduits can be mounted upon a package substrate, where the power conduits can deliver power to a semiconductor die. The power conduits in the IHS can provide up to 1000 micrometers ($\mu$m) of total lateral conductor length, significantly reducing the amount of horizontal and total resistance in the package substrate.

The IHS can be created by stamping. The stamping process can be tailored so that a cavity for a semiconductor die and grooves for power conduits are formed. It is understood that other, additional modifications may be made to the IHS based on the needs of the application. Once the grooves have been formed, an epoxy, adhesive film, or other insulator can be applied to the grooves to create an insulating layer. A ring having one or more tabs extending inward can also be stamped. The tabs can correspond to the grooves and can eventually form the power conduits. The ring can be lowered onto the IHS, and the tabs inserted into the grooves. The tabs will adhere to the epoxy in the grooves. After the ring has been lowered onto the IHS, the tabs can be removed from the ring. The remainder of the ring can then be discarded. Once the tabs have been removed, the power conduits have been formed in the IHS. The IHS and the power conduits can then be soldered onto the package substrate. The solder can align and couple the IHS and the power conduits with planes and vias in the package substrate. The power conduits can conduct a current $V_{CC}$ relative to the body of the IHS, which conducts a $V_{SS}$ ground.

Figure 2A:
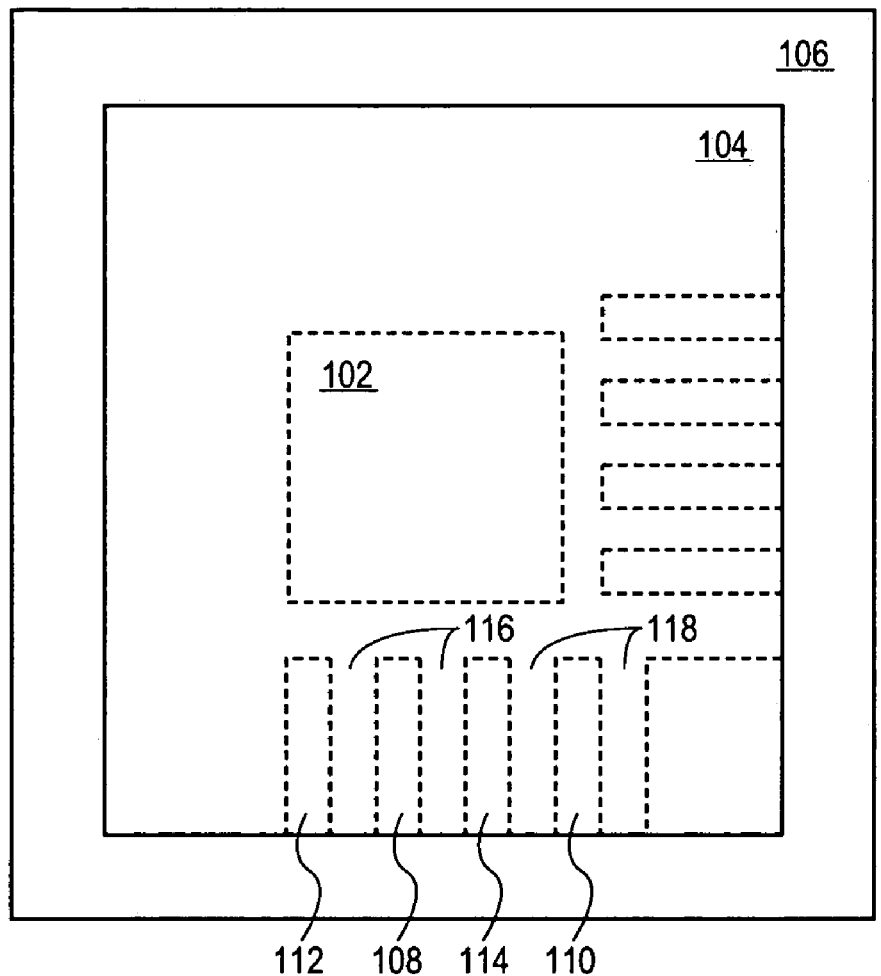
FIG. 2A illustrates an overhead view of a semiconductor package including an IHS having power conduits.

FIG. 2A illustrates an overhead view of a semiconductor package including an IHS having power conduits. The semiconductor package 100 includes a semiconductor die 102, which is covered by an IHS 104, both of which are mounted on a package substrate 106. The IHS 104 has grooves formed in it, which accommodate several power conduits, including power conduits 108 and 110, to carry a power current. The IHS terminals 112 and 114 carry a ground. The power conduits 108 and 110 and the IHS terminals 112 and 114 are isolated by insulating layers, such as an epoxy, 116 and 118.

Figure 2B:
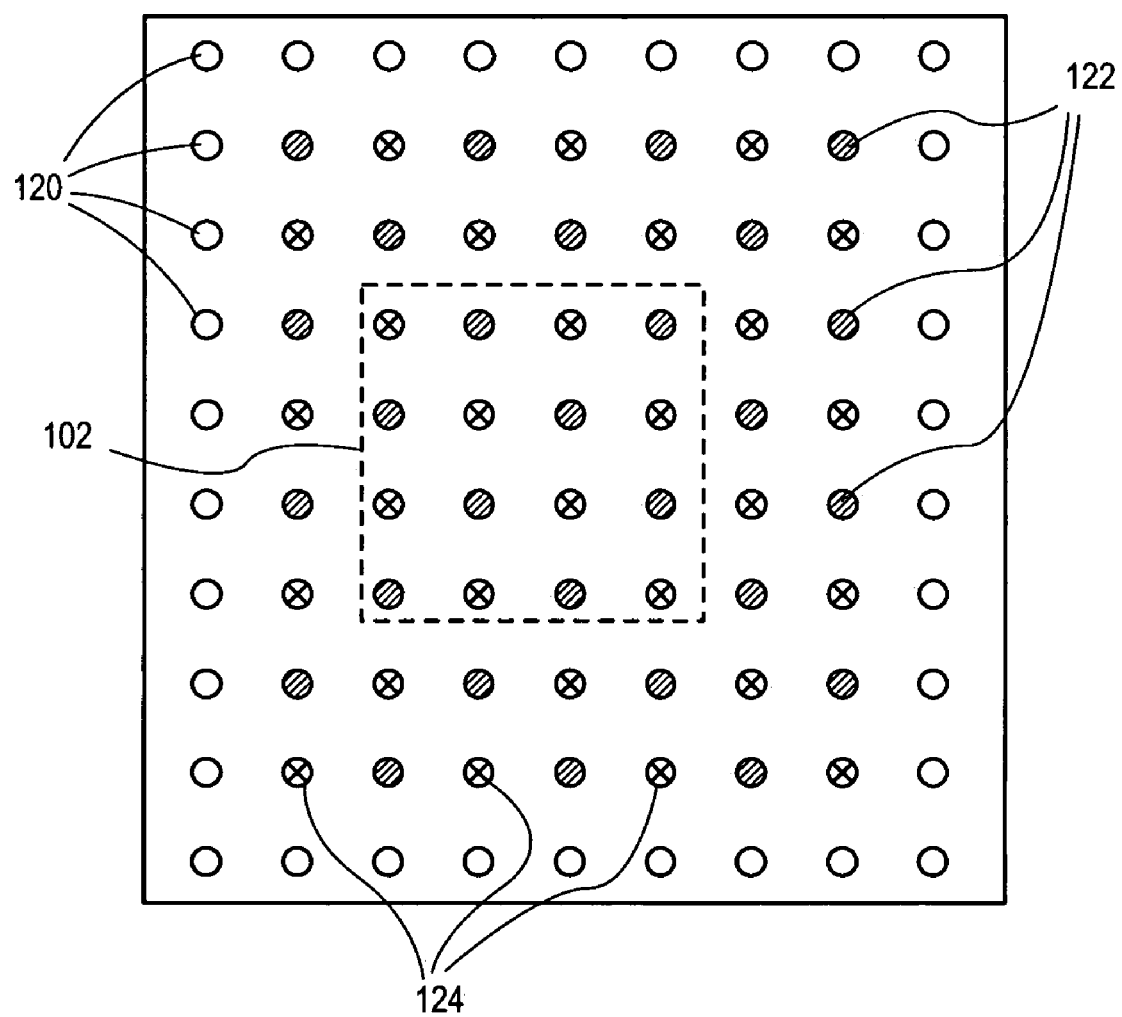
FIG. 2B illustrates another cross sectional view of a semiconductor package.

FIG. 2B illustrates a bottom view of a semiconductor package. The bottom of the semiconductor package 100 contains the external connections for the package. The signal pads 120, power pads 122, and ground pads 124 may be coupled to interconnects such as Ball Grid Array (BGA) interconnects, Pin Grid Array (PGA) interconnects, Land Grid Array (LGA) interconnects, etc. It is understood that the pads 120, 122, and 124 may be arranged in any fashion.

Figure 2C:
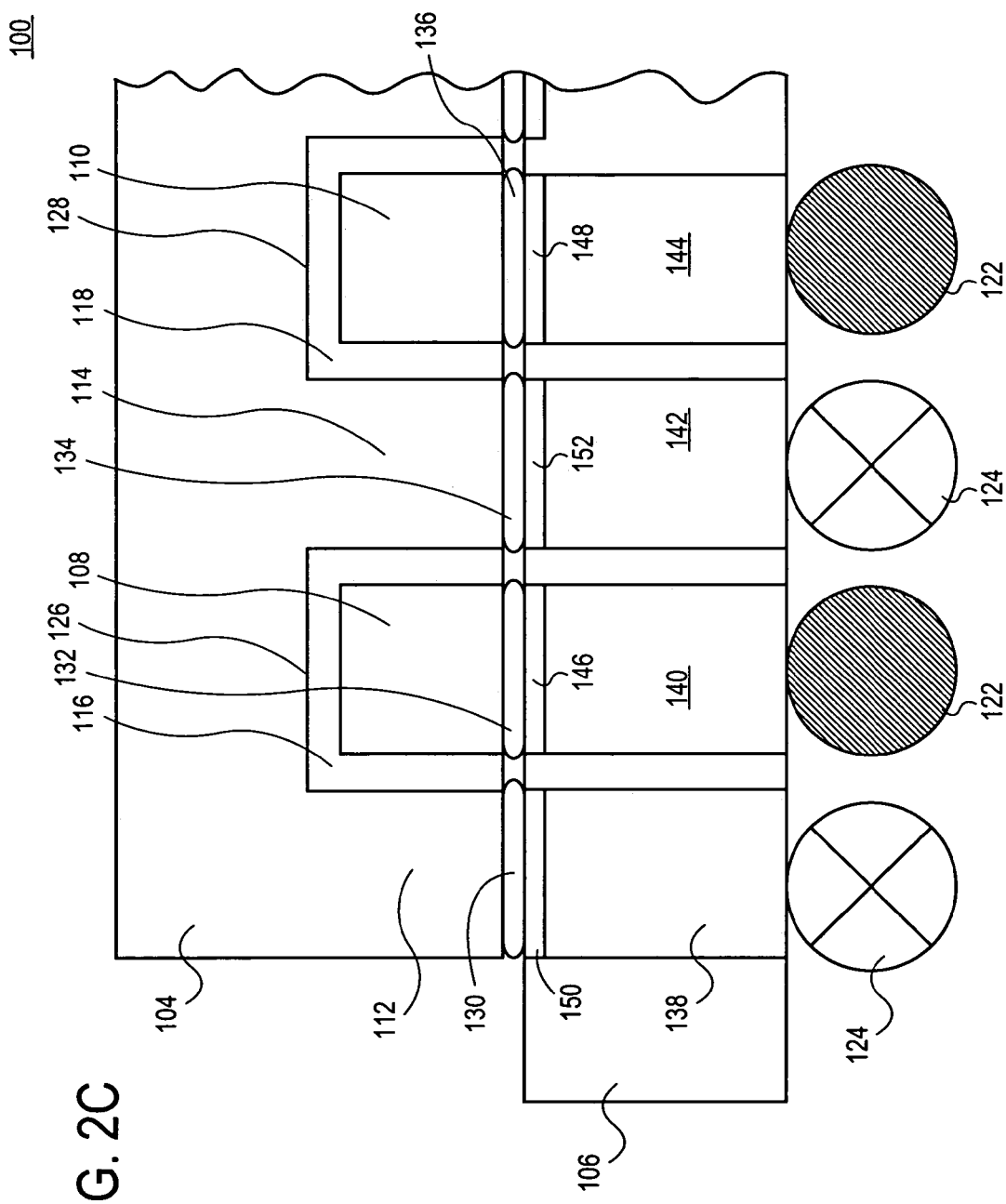
FIG. 2C illustrates a partial cross-sectional view of a semiconductor package including an IHS having power conduits.

FIG. 2C illustrates a partial cross-sectional view of a semiconductor package including an IHS having power conduits. The semiconductor package 100 includes an IHS 104 and a package substrate 106. The IHS 104 is mounted over the semiconductor die 102 and dissipates heat generated by the semiconductor die 102. The IHS 104 typically comprises copper. However, the IHS 104 may also comprise aluminum, graphite, carbon-based materials, etc. If the IHS 104 comprises aluminum, the aluminum may be anodized. The IHS 104 can still effectively remove heat from a semiconductor die even after the IHS 104 has been modified to carry power, because of the relatively small area through which heat from the die escapes.

When the IHS 104 is stamped, grooves 126 and 128 can be formed in the IHS 104. The grooves 126 and 128 can accommodate the power conduits 108 and 110. The power conduits 108 and 110 can conduct the voltage $V_{CC}$ relative to the IHS's 104 $V_{SS}$ ground. In one embodiment, the IHS 104 conducts a $V_{SS}$ ground, rather than a $V_{CC}$ voltage for safety reasons. In another embodiment, the power conduit 108 may carry $V_{CC}$, while the power conduit 110 carries +3.3V. Another power conduit may carry +2.7V, etc. The power conduits 108 and 110, as well as additional power conduits can be configured to carry several different voltages, as may be required by a semiconductor die. The body of the IHS 104 includes the terminals 112 and 114 that will communicate with the planes and vias in the package substrate 106. The IHS 104 is shown having only two power conduits 108 and 110 for simplicity. It is understood that the IHS 104 may have any number of power conduits deemed necessary.

The power conduits 108 and 110 are isolated from the IHS 104 by the insulating layers 116 and 118. The insulating layers 116 and 118 can insulate the power conduits 108 and 110 from the IHS 104, and can also secure the power conduits 108 and 110 to the IHS 104. The insulating layers 116 and 118 are applied to the grooves 126 and 128 before the power conduits 108 and 110 are inserted. In one embodiment, the insulating layers 116 and 118 comprise an epoxy. However, any appropriate insulating medium may be used. Any appropriate epoxy can be used, provided that the filler is insulating. The epoxy filler may comprise an insulating material such as silica.

Once the structure of the IHS 104, including the power conduits 108 and 110, is formed, the IHS 104 can be mounted upon the package substrate 106. In one embodiment, the IHS 104 and the power conduits 108 and 110 are mounted upon the package substrate 106 using a solder to create an electrical connection with the planes and vias in the package substrate 106. The solder balls 130, 132, 134, and 136 electrically couple the IHS terminals 112 and 114 and the power conduits 108 and 110 with the package substrate 106. The package substrate 106 may have up to several thousand vias, including vias 138, 140, 142, and 144. As mentioned above, the vias 138–144 typically do not create much resistance because the distance of the vertical travel of current through the package substrate 106 tends to be much shorter than the horizontal travel. Also, the vias 138–144 also tend to have a much larger cross-section than the horizontal planes. In one embodiment, the power conduits 108 and 110 will conduct most of the horizontal current traveling to the semiconductor die, because the power conduits 108 and 110 will typically have a much greater horizontal cross section than the planes in the package substrate 106.

The power conduits 108 and 110 and the IHS terminals 112 and 114 are coupled to the planes 146, 148, 150, and 152, respectively. The planes 146–152 are then coupled to the vias 138–144 which are then coupled to pads and interconnects 122 and 124 for external connections.

Figure 2D:
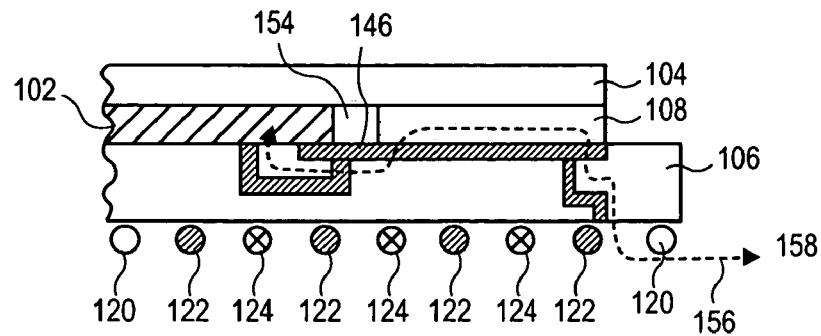
FIG. 2D illustrates another cross sectional view of a semiconductor package.

FIG. 2D illustrates another cross sectional view of a semiconductor package. As can be seen in FIG. 2D, the semiconductor die 102 is mounted upon the package substrate 106 and is also coupled with the IHS 104. The semiconductor die 102 may be mounted to the package substrate 106 using solder or another conductive medium to allow current to flow between the semiconductor die 102 and the package substrate 106. For example, the die 102 may be mounted using solder balls such as controlled collapse chip connection (C4) interconnects. The semiconductor die 102 can be mounted to the IHS 104 using an epoxy, solder, etc.

In one embodiment, there is a gap between the semiconductor die 102 and the power conduit 108 in order to maintain isolation between the two. In one embodiment, the gap 154 may be as small as one $\mu$m. In order to deliver the current being carried by the power conduit 108 to the semiconductor die 102, the plane 146 can be used to bridge the gap 154. The plane 146 can be on the surface of the package substrate 106 and may comprise multiple planes to reduce resistance. The plane 146 can physically contact solder balls or other connections between the die 102 and the package substrate 106. The current path 156 illustrates the travel of current from the power supply at the right end 158 through the package substrate 106, the power conduit 108, the plane 146, and into the semiconductor die 102. Since current will follow the path of least resistance, it will travel through the power conduit 108. As can be seen, the power conduit 108 has a large cross sectional area which will reduce resistance, therefore allowing additional power to be delivered to the semiconductor die 102. In high power applications, the power conduit 108 can be used in addition to a full compliment of planes in the package substrate 106. In another embodiment, the planes in the package substrate can be reduced or eliminated to reduce cost. Further, by reducing or eliminating the planes in the package substrate 106, there may be fewer problems caused by the rapid thermal expansion of the metal planes.

Figure 2E:
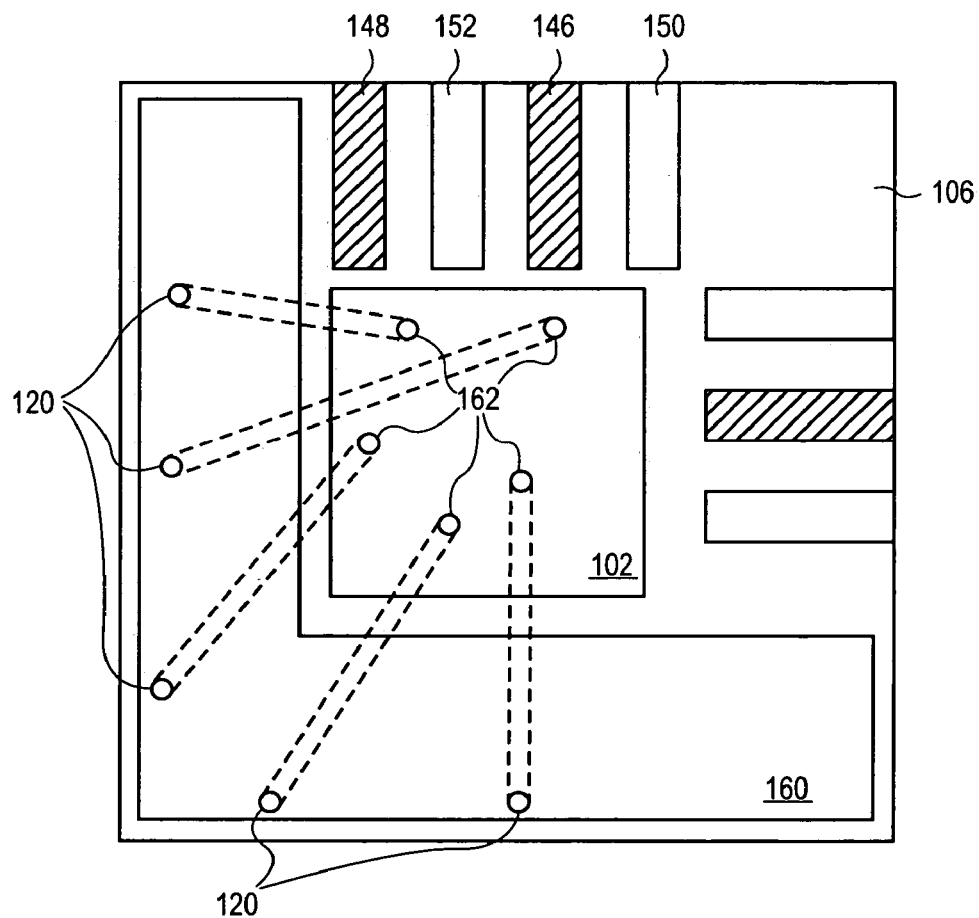
FIG. 2E illustrates an overhead view of a package substrate with an input/output (IO) breakout according to one embodiment.

FIG. 2E illustrates an overhead view of a package substrate 106 with an input/output (IO) breakout according to one embodiment. The package substrate 106 is coupled with the semiconductor die 102 and the IHS 104. The IHS 104 is not shown, so that the components underneath it are visible. An IO breakout 160 can distribute the IO contacts for the semiconductor die 102. For example, pads 162 on the die 102 may output signals. The pads 162 are connected, through planes and vias in the package substrate 106 to the pads 120, and eventually external to the package 100.

As can be seen in FIG. 2E, power is delivered on two sides of the semiconductor die 102. The IO breakout 160 is located on the remaining sides of the semiconductor die 102. In other embodiments, for example where less power is required, power conduits, ground terminals, and their corresponding planes may be used on only one side of the semiconductor die 102. Also, if the semiconductor die 102 requires many IO connections, the IO breakout 160 may cover three or four sides of the semiconductor die 102. If power conduits or the IO breakout 160 are used on all four sides of the semiconductor die 102, the IO breakout 160 or power terminals may also be placed on the back side of the package substrate 106, and connected from beneath. In another embodiment, a die with low IO counts may require very little space on the package substrate for IO, and the corresponding semiconductor package can be shrunk to reduce the size of the final package.

Figure 2F:
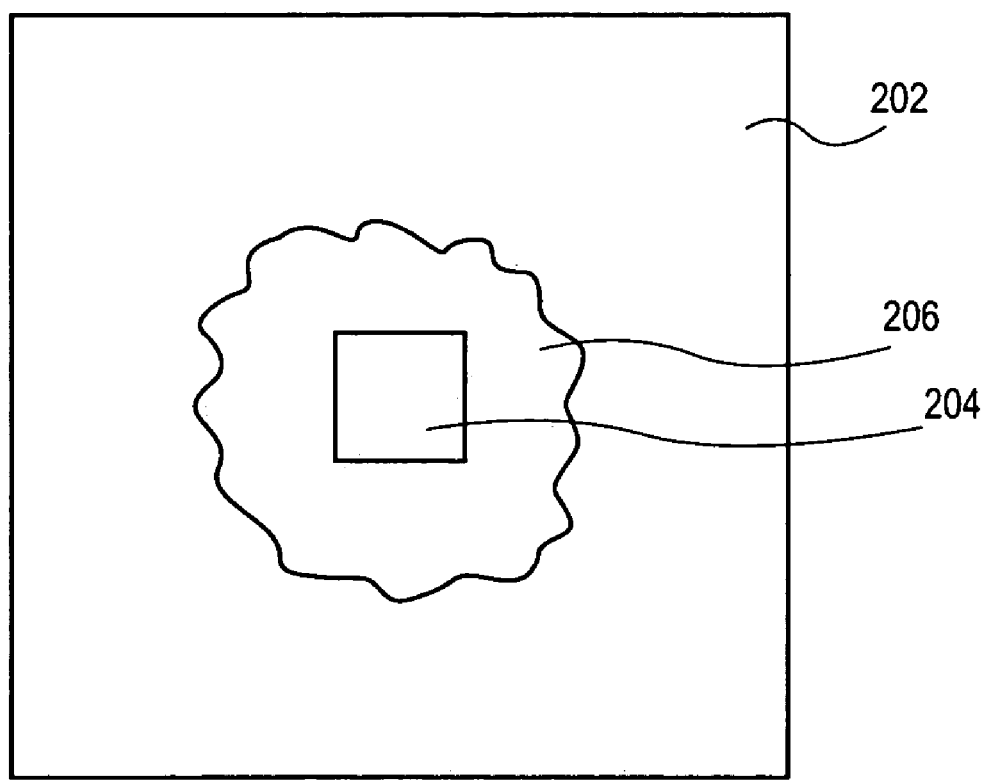
FIG. 2F illustrates an overhead view of an IHS.

FIG. 2F illustrates an overhead view of an IHS. The semiconductor package 200 comprises an IHS 202 having a semiconductor die 204 underneath. The IHS 202 is transparent to show the die 204. The heat emitted by the die 204 is shown as element 206. As can be seen, the dissipated heat 206 extends only a small distance away from the die 204. In other words, the heat dissipated 206 by a typical semiconductor die 204 tends to move quickly up and out of an IHS 202, and into the atmosphere, before it can spread very far. Therefore, much of the IHS 202 is not dissipating heat, and using the IHS to conduct current will not adversely affect its ability to cool the semiconductor die 204.

Figure 3A:
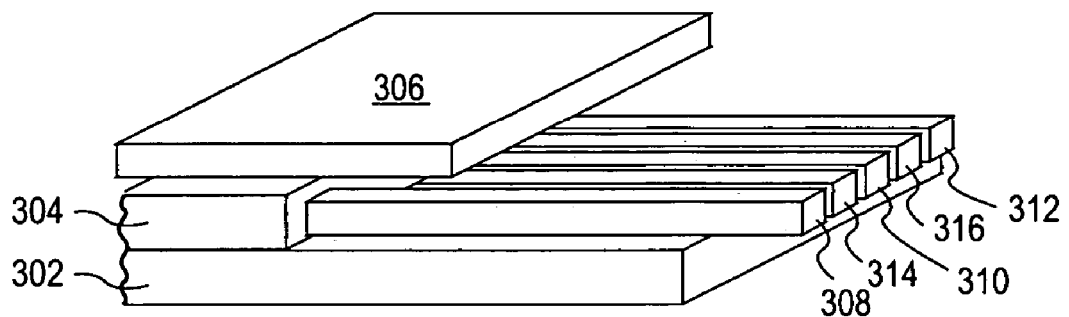
FIG. 3A illustrates a perspective view of an alternate embodiment in which the power conduits extend past an edge of the package substrate.
Figure 3B:
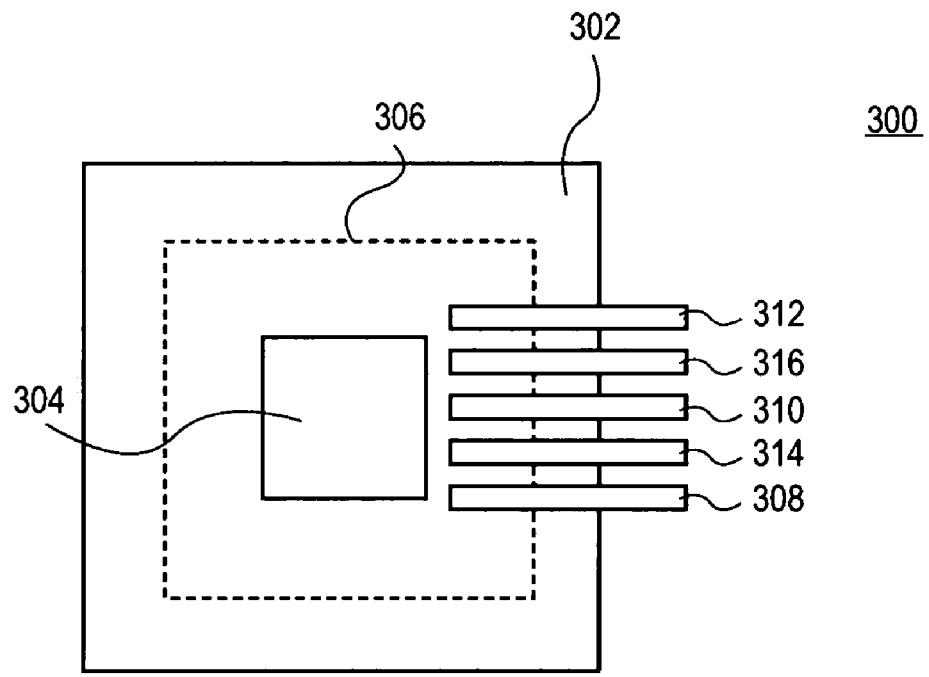
FIG. 3B illustrates an overhead view of the semiconductor package.

FIGS. 3A and 3B illustrate an alternate embodiment of a power conduit in an IHS. FIG. 3A illustrates a perspective view of an alternate embodiment in which the power conduits extend past an edge of the package substrate. The semiconductor package 300 comprises a package substrate 302, a semiconductor die 304, an IHS 306 and several power conduits 308, 310, and 312. As can be seen, the power conduits 308–312 extend past an edge of the package substrate 302. The power conduits 308–312 can comprise an edge connector to allow for simplified connections with the semiconductor die 304. FIG. 3B illustrates an overhead view of the semiconductor package 300. As can be seen in FIG. 3B, the power conduits 308–312 extend past the edge of the package substrate 302. As can also be seen in FIG. 3B, two ground terminals 314 and 316, which may comprise part of the IHS 306 are located between the power conduits 308, 310, and 312. The process of stamping the IHS 306 may be altered so as to add the extended ground terminals 314 and 316. In another embodiment, the terminals 314 and 316 may be extended after the IHS 306 is stamped. Although FIGS. 3A and 3B are shown having power conduits 308–312 only on one side of the package substrate 302, any configuration may be used.

Figure 4:
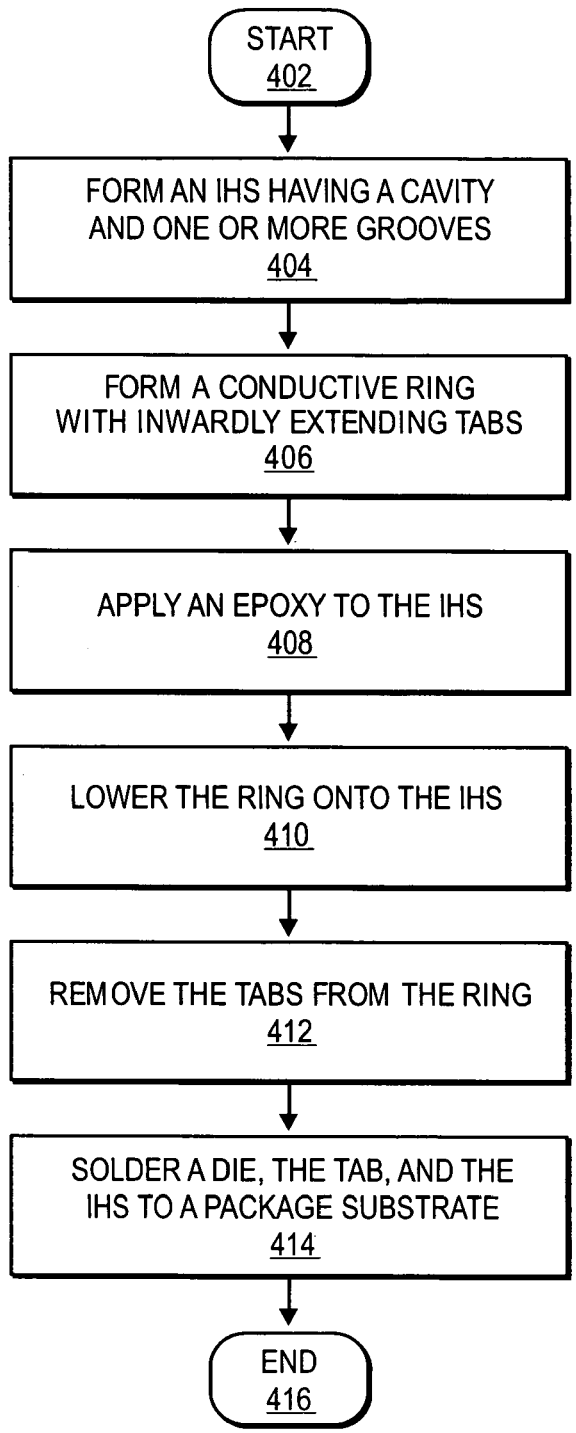
FIG. 4 illustrates an embodiment for forming an IHS having a power conduits integrated therein.
Figure 5A:
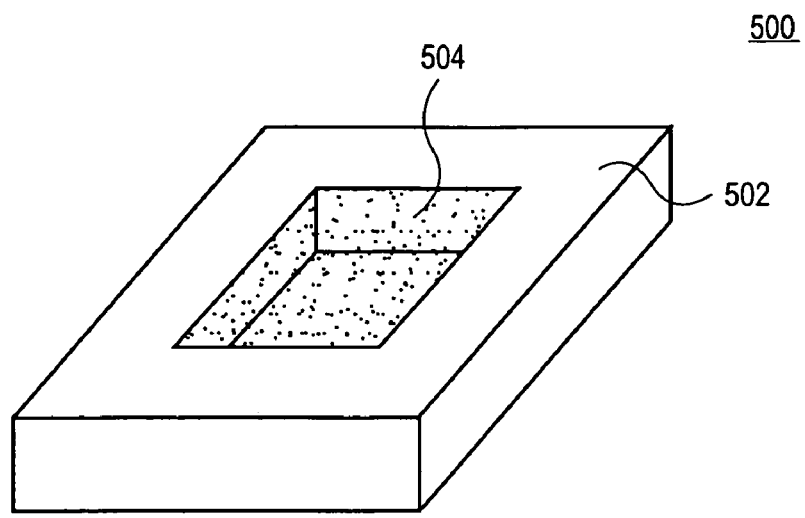
FIG. 5A illustrates a prior art stamped IHS.

FIG. 4 illustrates an embodiment for forming an IHS having a power conduits integrated therein. FIGS. 5A through 5E illustrate the process described in FIG. 4. The process 400 starts in start block 402. In block 404, an IHS is formed having one or more grooves and a cavity to accommodate a semiconductor die. FIG. 5A illustrates a prior art stamped IHS. The IHS 500 has an IHS main body 502 and a cavity 504 to accommodate a semiconductor die. The IHS 500 as shown is inverted. The IHS 500 typically comprises copper and may be formed using a stamping process. The stamping process creates the cavity 504 which is sized to accommodate a semiconductor die.

Figure 5B:
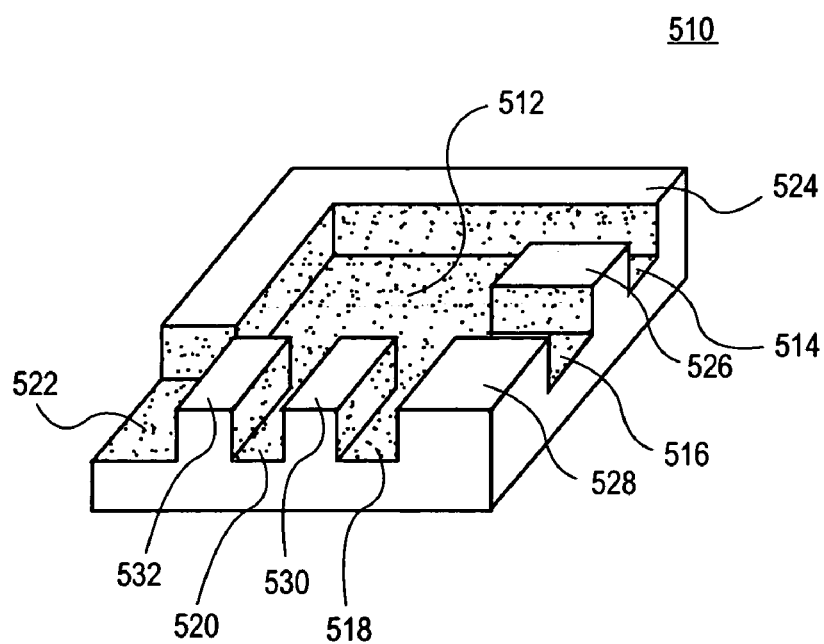
FIG. 5B illustrates a stamped IHS including a cavity and several grooves.

FIG. 5B illustrates a stamped IHS 510 including a cavity 512 and several grooves 514, 516, 518, 520, and 522. The grooves 514–522 can be formed during the same stamping process that formed the IHS 500. The die used to stamp the IHS 510 may be reconfigured to also stamp the grooves 514–522. The IHS 510 may comprise copper, aluminum, anodized aluminum, graphite, carbon-based materials, or any other appropriate material depending on the requirements of the application. The stamping process, which creates the grooves 514–522, will also create several grounding terminals 524, 526, 528, 530 and 532. Since the entire IHS 510 will be grounded relative to the power conduits, which will be inserted in the grooves 514–522, a ground may be found at any of the terminals 524–532. The ground terminals create a $V_{SS}$ ground relative to the $V_{CC}$ delivered by the power conduits. As noted above, the IHS may conduct differential power levels. For example, a power conduit in the groove 520 can conduct $V_{CC}$, while a power conduit in the groove 518 conducts +3.3V, and a power conduit in the groove 516 conducts +2.7V.

Figure 5C:
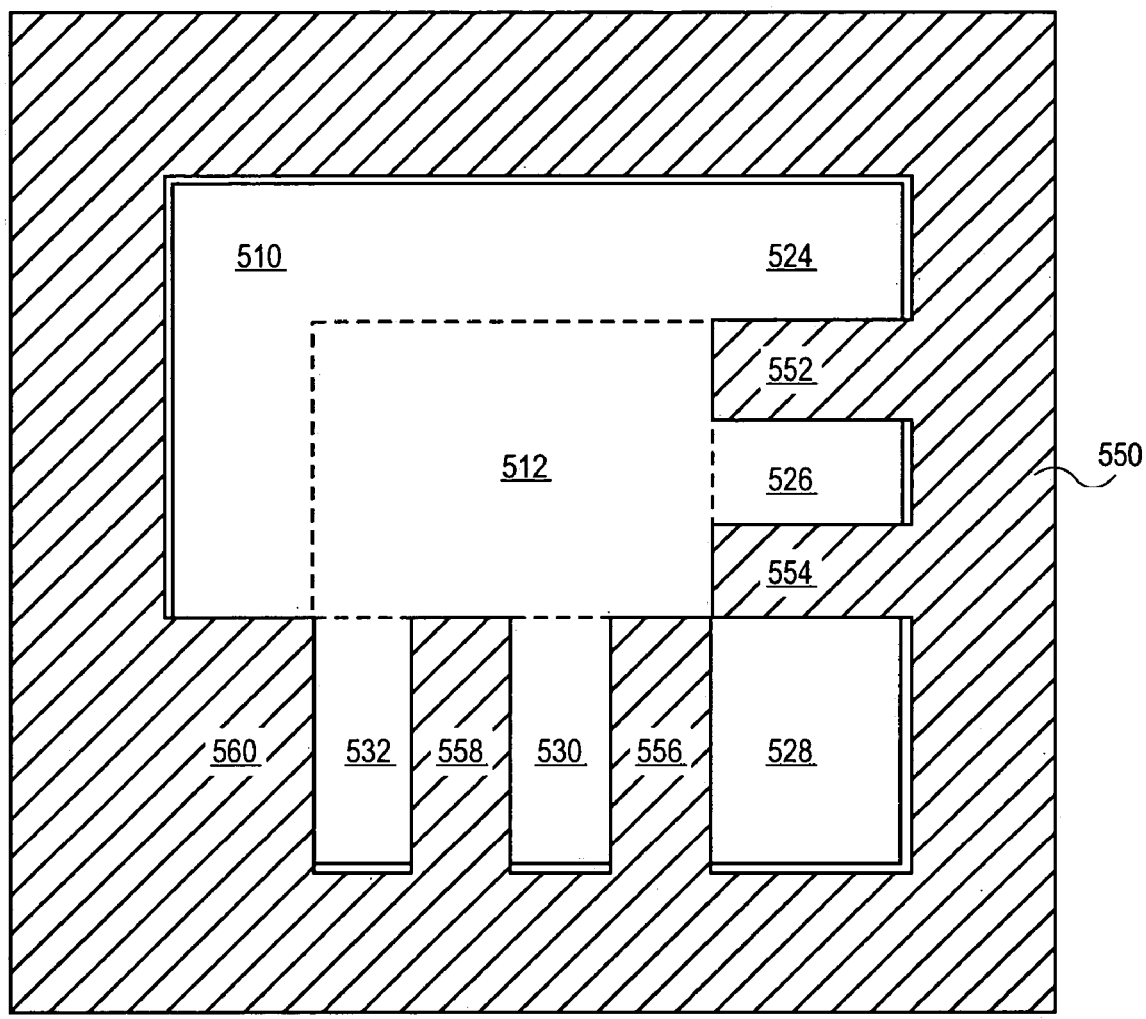
FIG. 5C illustrates a ring having several tabs inward extending.

In block 406, a conductive ring having inwardly extending tabs is formed. FIG. 5C illustrates a ring 550 having several tabs inward extending. The ring 550 may be copper, aluminum, or another appropriate conductive material. The conductive material can be chosen based on a number of criteria including conductivity, price, etc. The ring 550 is sized so that when it is placed over the IHS 510, the ring 550 will be larger than the IHS 510. The tabs 552, 554, 556, 558 and 560 are sized to fill the grooves 514–522. As can be seen in FIG. 5C, the ring 550 has an inner perimeter that is approximately the same size or larger than the outer perimeter of the IHS 510. In this way, the ring 550 can fit over the IHS 510 and the tabs 552–560 can fit into the grooves 514–522. The ring 550 has an appropriate thickness to insure proper fit of the tabs 552–560 in the grooves 514–522.

Figure 5D:
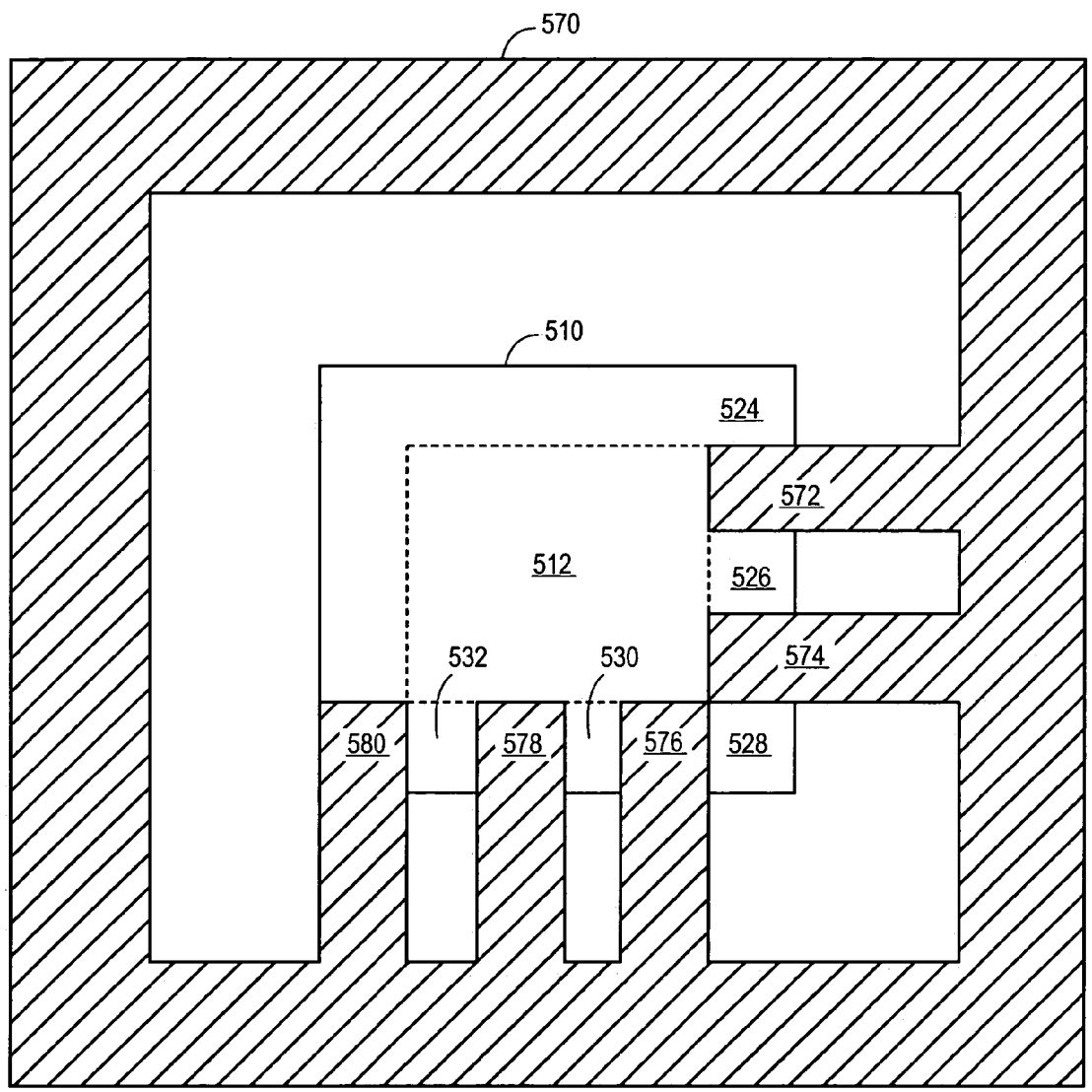
FIG. 5D illustrates a ring having long tabs extending inward.

In one embodiment, a ring 550 may have tabs that extend beyond the edge of the IHS 510. FIG. 5D illustrates a ring having long tabs extending inward. The ring 570 is much larger than the IHS 510. The tabs 572, 574, 576, 578, and 580 may be longer than the grooves 514–522, so long as the tabs 552–560 do not extend too far inward so as to intrude on the cavity 512. The tabs 572–580 can later be separated from the ring to create contacts for an edge connector. In one embodiment, the tabs 576, 578, and 580 may be separated from the ring 570 near the inner perimeter of the ring 570 in order to create long power conduits and an edge connector. The tabs 572 and 574 may be separated so that the resulting power conduits are flush at the edge of the IHS 510 if no edge connector is needed on that side of the package. The edge connector may be similar to that described with respect to FIGS. 3A and 3B. It is understood that any configuration of long and short contacts may be used depending on the specific requirements of a particular application.

In block 408, an epoxy is applied to the grooves of the IHS 510. Epoxy is deposited in the grooves 514–522 so that the tabs 552–560 will adhere to the grooves 514–522 when the ring 550 is lowered onto the IHS 510. The epoxy may be applied all over the grooves 514–522 to provide insulation, while not impacting the ability of the IHS 510 to conduct heat from the die to the atmosphere. The epoxy also electrically insulates the power conduits from the IHS 510. The epoxy can be any appropriate epoxy, so long as the filler material is an electrically isolating material such as silica. In another embodiment, other insulating materials, both adhesive and non adhesive, may be used to separate the tabs 552–560 from the IHS 510.

In block 410, the ring 550 is lowered onto the IHS 510, and the tabs are inserted into the grooves. Since the ring 550 is larger than the IHS 510, when the ring 550 is lowered onto the IHS 510, the corresponding tabs 552–560 will be inserted into the corresponding grooves 514–522. In block 412, once the ring 550 has been lowered onto the IHS 510 and the epoxy is cured, the tabs 552–560 may be removed from the ring 550. Any appropriate method may be used to separate the tabs 552–560 from the ring 550. The tabs 552–560 may also be ground or polished back to the edge of the IHS 510 if necessary. Further, as described above, if using long tabs 572–580 to create an edge connector, certain tabs may be removed at different locations to create longer and shorter tabs in order to create the connector. In an alternate embodiment, the power conduits may be preformed separately and placed in the grooves 514–522 individually using a pick-and-place or other appropriate procedure.

Figure 5E:
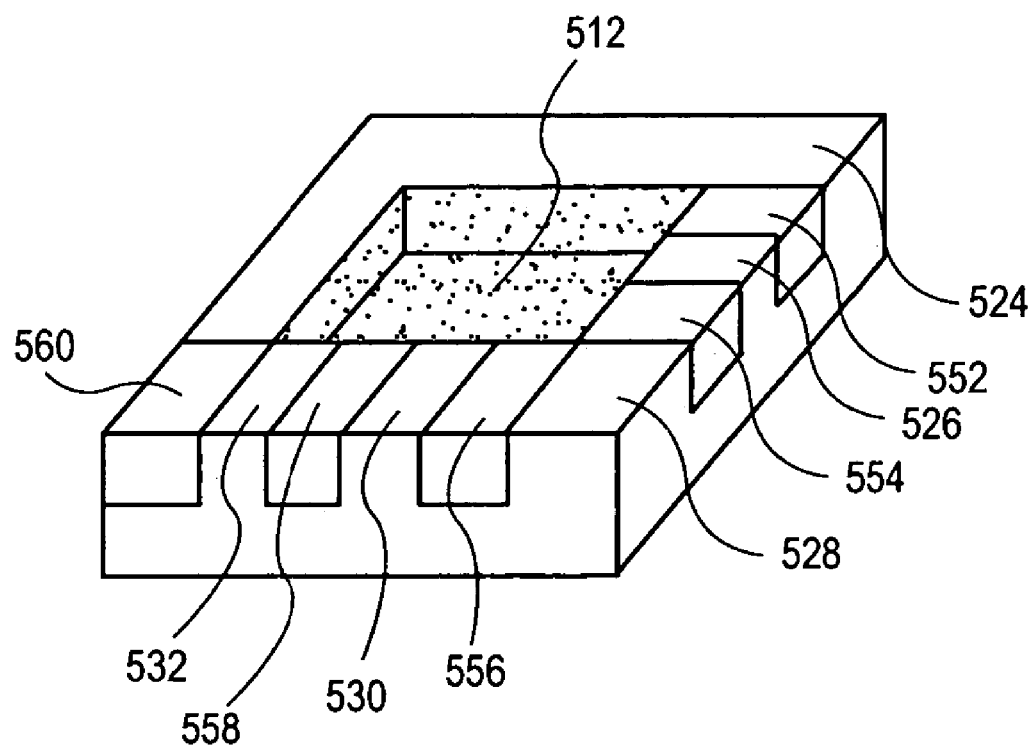
FIG. 5E illustrates an IHS having several power conduits.

FIG. 5E illustrates the IHS 510 having several power conduits. The tabs 552–560 become the power conduits 552–560. The IHS 510, as shown in FIG. 5D, is inverted. That is, when the IHS 510 is placed on a package substrate, the cavity 512 would be placed over a die a semiconductor die. The IHS 510 in FIG. 5D is a completed IHS having power conduits 552–560. The power conduits 552–560 can conduct a $V_{CC}$ voltage relative to the $V_{SS}$ of the IHS 510. When the IHS 510 is placed upon a package substrate, the power conduits 552–560 and the ground terminals 524–532 can each be electrically coupled with a package substrate. The power conduits 552–560 and the ground terminals 524–532 of the IHS 510 can then deliver power from an edge of a package substrate toward a semiconductor die.

In block 414, a semiconductor die is soldered onto a package substrate, the IHS 510 is soldered onto the package substrate, and the tabs are soldered onto the package substrate. In order for the IHS 510 to function as a power delivery device, the IHS must be attached to a package substrate in a manner that ensures an electrical connection with the vias of the package substrate. Solder, such as tin solder, may be used to couple the IHS and power conduits with the package substrate. Other types of solder, such as lead solders, indium solders, etc. may be used, as well as electrically conductive epoxies. Other manners of attaching an IHS 510 to a package substrate, such as using insulating epoxies, will not create an electric connection. Therefore, a conductive material should be used to insure an electrical connection between the IHS 510 and the package substrate. In block 416, the process 400 is complete and a semiconductor package utilizing an IHS to increase power deliver has been created.

An IHS is required in many semiconductor packages because semiconductor devices generate excessive heat that must be removed. The IHS typically comprises a conductive material, such as copper or aluminum, to dissipate heat. Newer, high power semiconductor devices may require additional power in order to operate. Package substrates typically can only provide up to 400 $\mu$m of horizontal planes for power delivery. Planes typically create the more electrical resistance than vias because they are longer and have a smaller cross-section. An IHS, since it already comprises a conductive material, can also supply power to a semiconductor die. An IHS may be stamped with grooves in it. The grooves can then be coated with an electrically isolating material. Finally, conductive power conduits can be inserted into the grooves of the IHS. Since the grooves of the IHS are electrically isolated from the IHS itself, the power conduits inserted in the grooves can conduct a current having a voltage relative to the IHS. Therefore, the power conduits can conduct the voltage $V_{CC}$ and the IHS itself can conduct a ground $V_{SS}$. The IHS is typically much larger than the planes in the package substrate. Therefore, the IHS and the power conduits are capable of conducting much more current than the planes in the package substrate, and can significantly reduce the amount of resistance encountered in a semiconductor package. The IHS can provide as much as one millimeter of horizontal conductor length, a significant increase over current power delivery techniques.

This invention has been described with reference to specific exemplary embodiments thereof. It will, however, be evident to persons having the benefit of this disclosure that various modifications and changes may be made to these embodiments without departing from the broader sprit and scope of the invention. The specification and drawings, are accordingly, to be regarded in an illustrative rather than a restrictive sense.

What is claimed is:

1. An apparatus, comprising:
   an integrated heat spreader (IHS) having a groove and a cavity formed therein;
   an insulating layer formed in the groove; and
   a power conduit mounted in the groove, the power conduit electrically isolated from the IHS by the insulating layer, wherein the power conduit conducts a voltage relative to the IHS to deliver power to the cavity.

2. The apparatus of claim 1, wherein the cavity is to accommodate a semiconductor die, and the power conduit is to deliver power to the semiconductor die.

3. The apparatus of claim 2, further comprising:
   a package substrate coupled with the IHS, the power conduit, and the semiconductor die.

4. The apparatus of claim 3, wherein the IHS and the power conduit are soldered to the package substrate.

5. The apparatus of claim 3, wherein the power conduit is mounted on a first side of the IHS, and a second power conduit is mounted on a second side of the IHS.

6. The apparatus of claim 5, further comprising:
   a first input/output (IO) breakout mounted on the package substrate on a third side opposite the first side of the IHS; and
   a second IO breakout mounted on the package substrate on a fourth side opposite the second side of the IHS.

7. The apparatus of claim 4, wherein the power conduit extends past an edge of the package substrate.

8. The apparatus of claim 7, wherein the power conduit comprises an edge connector.

9. The apparatus of claim 1, wherein the insulating layer is chosen from the group consisting of an epoxy and an adhesive film.

10. The apparatus of claim 1, wherein the power conduit conducts a $V_{CC}$ voltage, and wherein the IHS conducts a $V_{SS}$ ground.

* * * * *